(12) United States Patent
Chaturvedi et al.

(10) Patent No.: US 10,642,536 B2
(45) Date of Patent: May 5, 2020

(54) NON-VOLATILE STORAGE SYSTEM WITH HOST SIDE COMMAND INJECTION

(71) Applicant: Western Digital Technologies, Inc., San Jose, CA (US)

(72) Inventors: Ankita Chaturvedi, Santa Clara (CA); Judah Gamliel Hahn, Ofra (IL)

(73) Assignee: Western Digital Technologies, Inc., San Jose, CA (US)

( * ) Notice: Subject to any disclaimer, the term of this patent is extended or adjusted under 35 U.S.C. 154(b) by 207 days.

(21) Appl. No.: 15/912,944

(22) Filed: Mar. 6, 2018

(65) Prior Publication Data
US 2019/0278514 A1 Sep. 12, 2019

(51) Int. Cl.
*G06F 3/06* (2006.01)
*G11C 29/44* (2006.01)
*G11C 29/36* (2006.01)
*G11C 29/38* (2006.01)

(52) U.S. Cl.
CPC .......... *G06F 3/0659* (2013.01); *G06F 3/0619* (2013.01); *G06F 3/0679* (2013.01); *G11C 29/36* (2013.01); *G11C 29/38* (2013.01); *G11C 29/44* (2013.01)

(58) Field of Classification Search
CPC ............................... G06F 3/0619; G06F 3/0659
See application file for complete search history.

(56) References Cited

U.S. PATENT DOCUMENTS

| | | | |
|---|---|---|---|
| 5,931,954 A | * | 8/1999 | Hoshina ............... G06F 11/1407 714/15 |
| 7,254,765 B2 | | 8/2007 | Meyer |
| 7,266,750 B1 | | 9/2007 | Patapoutian |
| 7,849,383 B2 | | 12/2010 | Lin |
| 8,301,979 B2 | | 10/2012 | Sharon |
| 8,321,627 B1 | | 11/2012 | Norrie |
| 8,479,077 B2 | | 7/2013 | Lee |
| 9,201,777 B2 | | 12/2015 | Hsu |
| 2004/0190523 A1 | | 9/2004 | Gessner |
| 2008/0244338 A1 | | 10/2008 | Mokhlesi |
| 2008/0250300 A1 | | 10/2008 | Mokhlesi |
| 2008/0276156 A1 | | 11/2008 | Gunnam |
| 2008/0301521 A1 | | 12/2008 | Gunnam |
| 2009/0106626 A1 | | 4/2009 | Hou |
| 2013/0151755 A1 | | 6/2013 | Elhamias |
| 2014/0105036 A1 | | 4/2014 | Anschutz |
| 2014/0181428 A1 | | 6/2014 | Hsu |
| 2014/0229658 A1 | | 8/2014 | Maharana |
| 2015/0195374 A1 | | 7/2015 | Wang |

(Continued)

OTHER PUBLICATIONS

Notice of Allowance dated Oct. 31, 2018, U.S. Appl. No. 15/274,037.

(Continued)

*Primary Examiner* — Zachary K Huson
(74) *Attorney, Agent, or Firm* — Vierra Magen Marcus LLP

(57) ABSTRACT

To replay a series of commands for debugging (or other purposes), a memory device writes the commands to an alternate data structure in a host's physical memory. The memory device switches its own queuing and command processing infrastructure such that it executes against this alternate data structure instead of the primary data structure originally specified by the host.

19 Claims, 11 Drawing Sheets

(56) References Cited

U.S. PATENT DOCUMENTS

| | | |
|---|---|---|
| 2015/0254129 A1 | 9/2015 | Authement |
| 2016/0004438 A1 | 1/2016 | Moon |
| 2016/0026406 A1 | 1/2016 | Hahn |
| 2016/0070486 A1 | 3/2016 | Anderson |
| 2016/0246726 A1 | 8/2016 | Hahn |
| 2017/0031845 A1 | 2/2017 | Tzafrir |
| 2017/0242606 A1 | 8/2017 | Vlaiko |
| 2017/0242820 A1 | 8/2017 | Pupanagunta |
| 2018/0018101 A1 | 1/2018 | Benisty et al. |
| 2018/0039578 A1 | 2/2018 | Yun et al. |
| 2018/0089024 A1 | 3/2018 | Hahn |
| 2018/0285198 A1* | 10/2018 | Dantkale ............... G06F 12/128 |

OTHER PUBLICATIONS

PCT International Search Report dated Mar. 11, 2019, PCT Patent Application No. PCT/US2018/061826.

PCT Written Opinion of the International Searching Authority dated Mar. 11, 2019, PCT Patent Application No. PCT/US2018/061826.

Office Action dated Mar. 28, 2018, U.S. Appl. No. 15/274,037.

NVM Express, Revision 1.2.1, Jun. 5, 2016, available at http://nvmexpress.org.

Brewer, et al., "Disks for Data Centers, White paper for FAST 2016," Feb. 23, 2016 available at http://research.google.com/pubs/pub44830.html.

Strass, "An Introduction to NVMe," Seagate Technology LLC, 2016.

Native Command Queuing (NCQ) defined, Sandisk Global Customer Care, 2018 Western Digital Corporation, available at https://kb.sandisk.com/app/answers/detail/a_id/8146/~native-command.

NVM Express, Revision 1.3, May 1, 2017, available at http://nvmexpress.org.

NVM Express Introduction and History, NVM Express, Inc., Jul. 2017.

Huffman, "NVM Express: Optimized Interface for PCI Express* SSDs," Intel Corporation 2013.

PCIe SSD 101, An Overview of Standards, Markets and Performance, Storage Networking Industry Association, SNIA Solid State Storage Initiative, Aug. 2013.

"The Synopsys NVMe vip: A High Level View," VIP Central, Sep. 17, 2015, available at https://blogs.synopsys.com/vip-central/2015/09/17/the-synopsys-nvme-vip-a-high-level-view/.

Response to Office Action dated Jun. 28, 2018, U.S. Appl. No. 15/274,037.

* cited by examiner

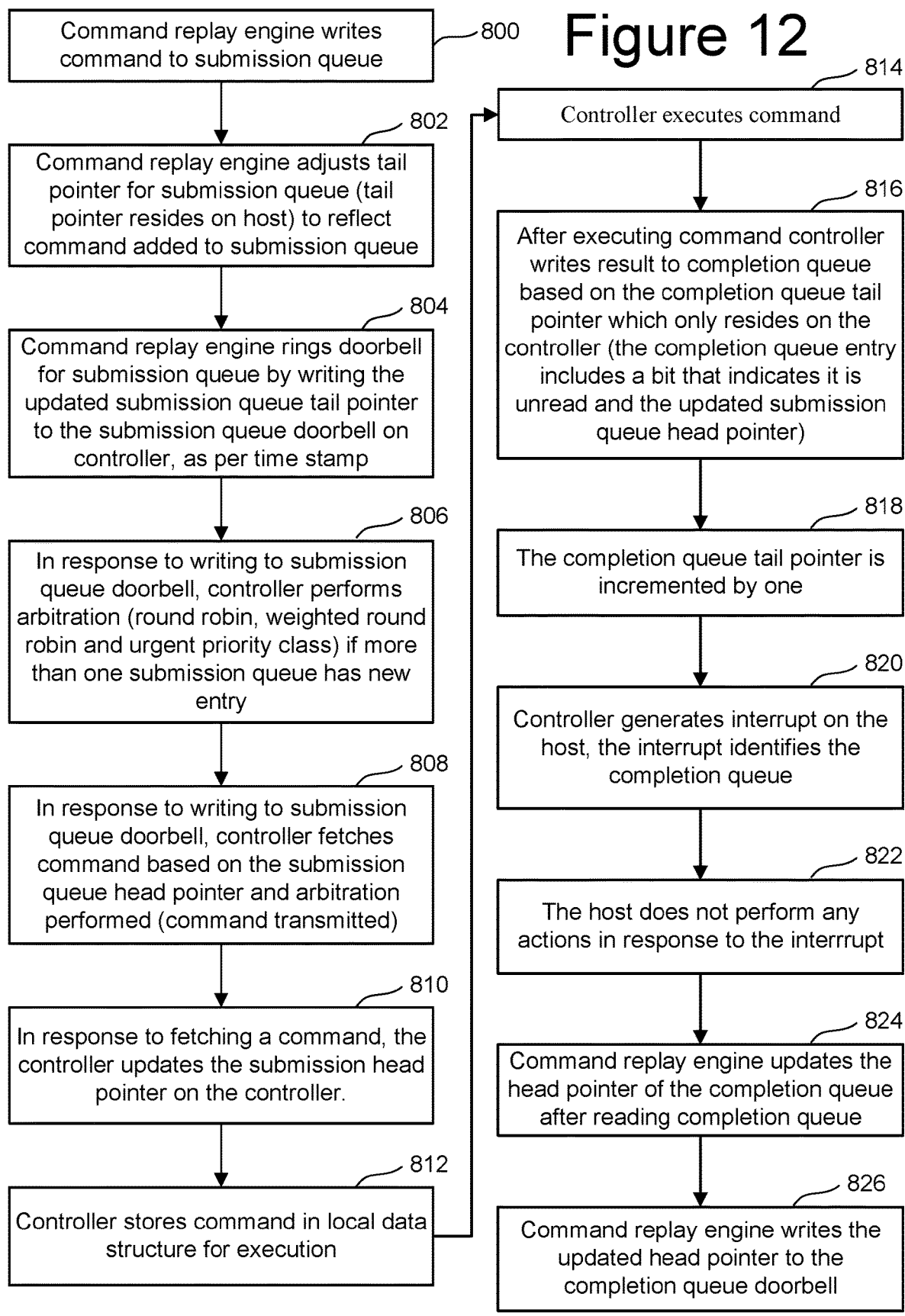

NON-VOLATILE STORAGE SYSTEM WITH HOST SIDE COMMAND INJECTION

BACKGROUND

Many electronic devices make use of memory systems. Often, the memory system includes non-volatile memory such as flash memory. An electronic device that includes a memory system, or is connected to a memory system, is often referred to as a host.

During the development, qualification, and field debug of memory systems, certain exception or error conditions may be triggered by specific sequences of commands from the host. For example, a thermal stress reaction may occur after a very long write workload, or a timeout might occur at a specific queue depth when the commands within the queue are long-running. Under certain circumstances, a reset occurring during a specific command sequence may also trigger internal bugs or errors in the device. Identifying and addressing these situations often requires capturing bus traces of the host-memory interactions, and analyzing these traces for specific anomalies which indicate that an error has occurred. Since the interface between the host and memory is not normally monitored, debugging usually requires recreating the exact conditions that caused the error while monitoring/logging the activity on the interface. However, it can be difficult to recreate the exact conditions that cause an error.

BRIEF DESCRIPTION OF THE DRAWINGS

Like-numbered elements refer to common components in the different figures.

FIG. 12 is a flow chart describing one embodiment of a process for executing a command while replaying (or re-executing) a sequence of commands.

DETAILED DESCRIPTION

As described above, certain error conditions may be triggered by specific sequences of command from the host. Reproducing the exact conditions that cause an error in order to facilitate debugging may require replaying the same sequence of commands from the host. Therefore, a memory system is proposed that, after executing a sequence of commands, can replay the same sequence of commands by injecting a copy of those commands into the host-memory system interface.

One embodiment includes a memory system comprising non-volatile memory and a Controller connected to the non-volatile memory. The Controller is configured to write a set of commands to an alternate data structure in a host's physical memory and switch its command pointer from referencing a primary data structure to referencing the alternate data structure. In response to the command pointer being switched, the Controller is configured to execute against the alternate data structure rather than the primary data structure. As the alternate data structure will have a copy of the commends already executed, the memory system will be able to replay those commands as if they were being reissued from the host.

Figure 1:
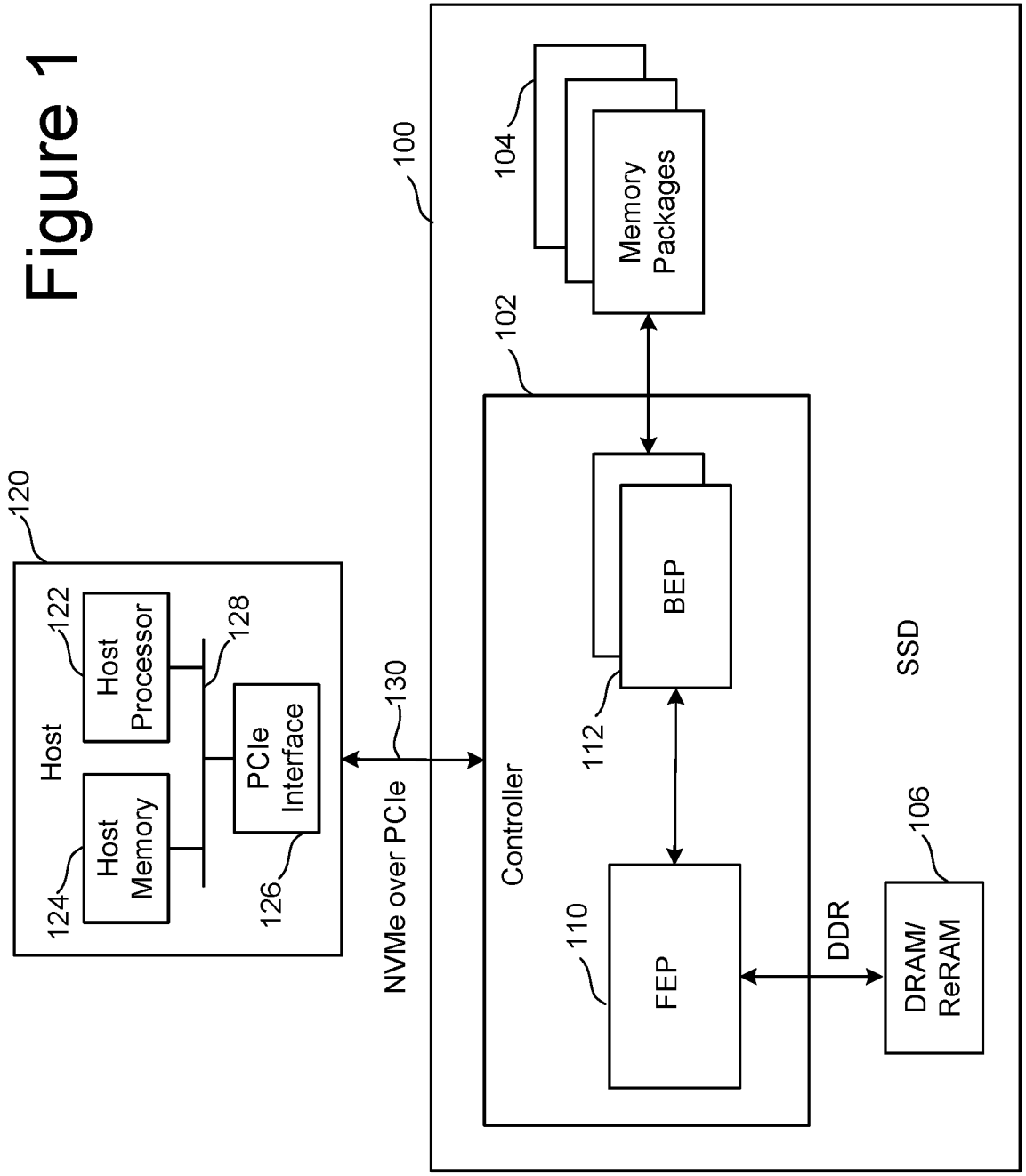
FIG. 1 is a block diagram of one embodiment of a memory system connected to a host.

FIG. 1 is a block diagram of one embodiment of a memory system 100 connected to a host 120. Memory system 100 can implement the technology proposed herein. Many different types of memory systems can be used with the technology proposed herein. One example memory system is a solid state drive ("SSD"). Memory system comprises a Controller 102, non-volatile memory 104 for storing data, and local memory (e.g. DRAM/ReRAM) 106. Controller 102 comprises a Front End Processor Circuit (FEP) 110 and one or more Back End Processor Circuits (BEP) 112. In one embodiment FEP110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the Controller 102 is manufactured as a System on a Chip ("SoC"). FEP 110 and BEP 112 both include their own processors. In one embodiment, FEP110 and BEP 112 work as a master slave configuration where the FEP110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages.

In one embodiment, non-volatile memory 104 comprises a plurality of memory packages. Each memory package includes one or more memory die. Therefore, Controller 102 is connected to one or more non-volatile memory die. In one embodiment, each memory die in the memory packages 14 utilize NAND flash memory (including two dimensional NAND flash memory and/or three dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126. Host memory 124 is the host's physical memory, and can be DRAM, SRAM, non-volatile memory or another type of storage. Host 120 is external to and separate from memory system 100 (e.g., an SSD). In one embodiment, memory system 100 is embedded in host 120.

As will be described in more detail below, Controller 102 includes a command log configured to store a copy of a sequence of commands received from host 120 and executed by the Controller 102. Controller 102 also includes a means for replaying the sequence of commands after they have been executed by reading the commands from the command log, writing the commands read to a memory on host 120, and executing (at Controller 120) the commands from memory 124 on host 120.

Figure 2:
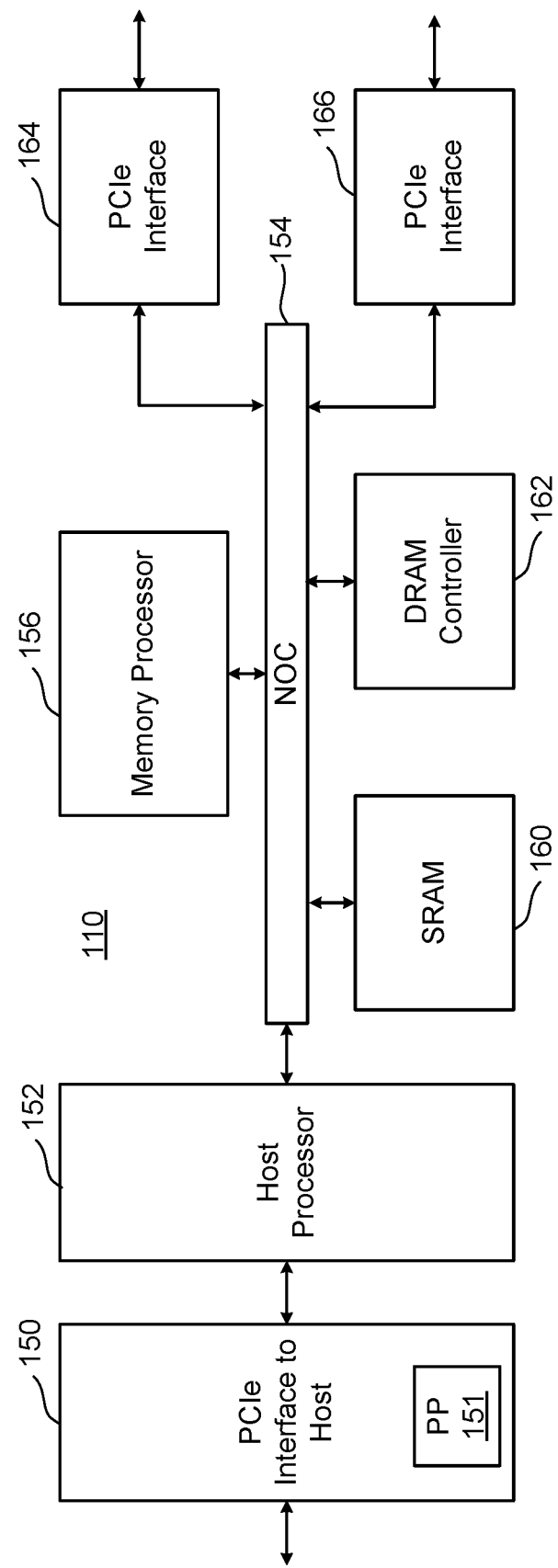
FIG. 2 is a block diagram of one embodiment of a Front End Processor Circuit. The Front End Processor Circuit is part of a Controller.

FIG. 2 is a block diagram of one embodiment of FEP circuit 110. FIG. 2 shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 2, the SSD controller will include two BEP circuits 112; therefore there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 3:
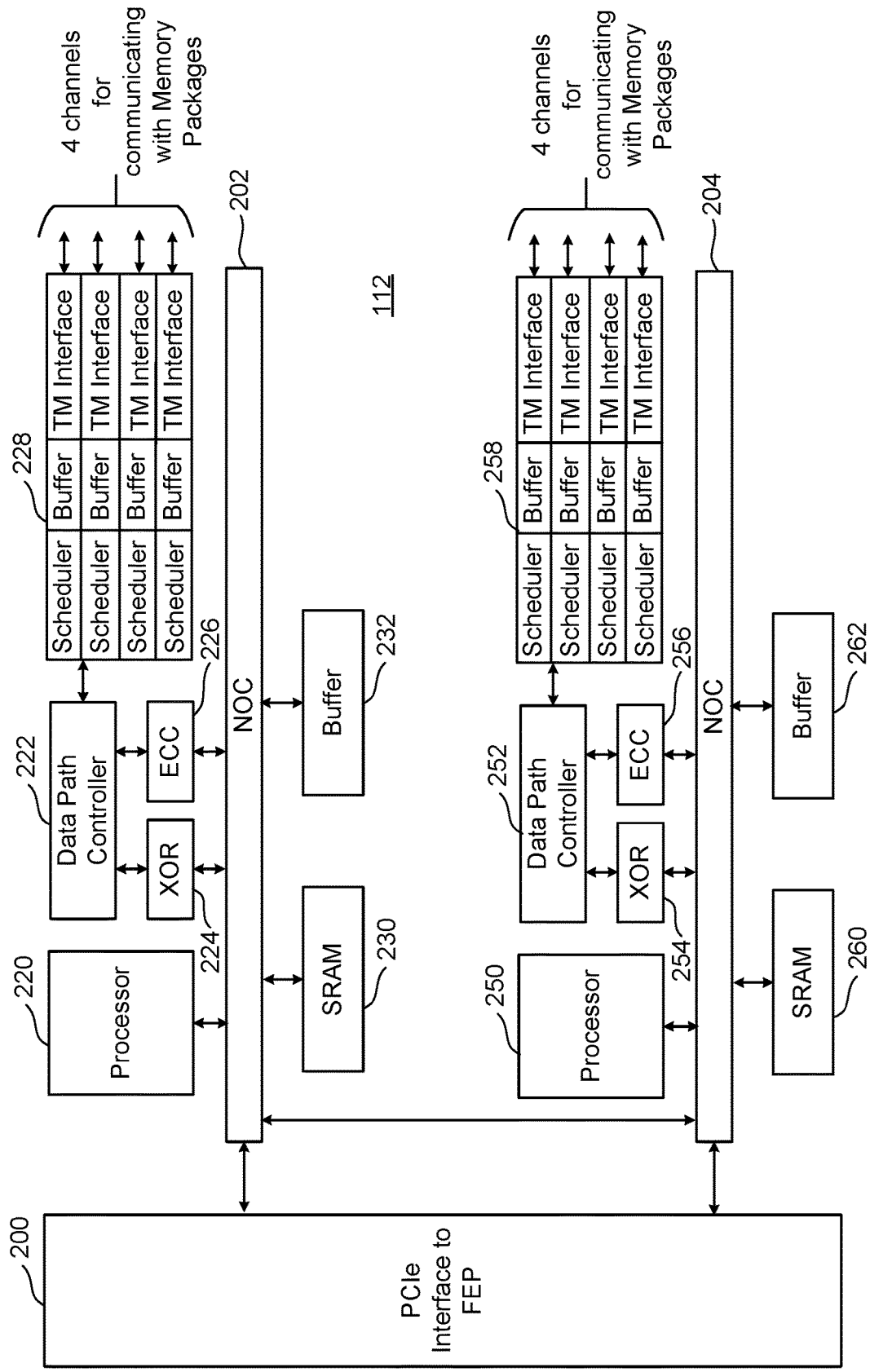
FIG. 3 is a block diagram of one embodiment of a Back End Processor Circuit. In some embodiments, the Back End Processor Circuit is part of a Controller.

FIG. 3 is a block diagram of one embodiment of the BEP circuit 112. FIG. 3 shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 22 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 4:
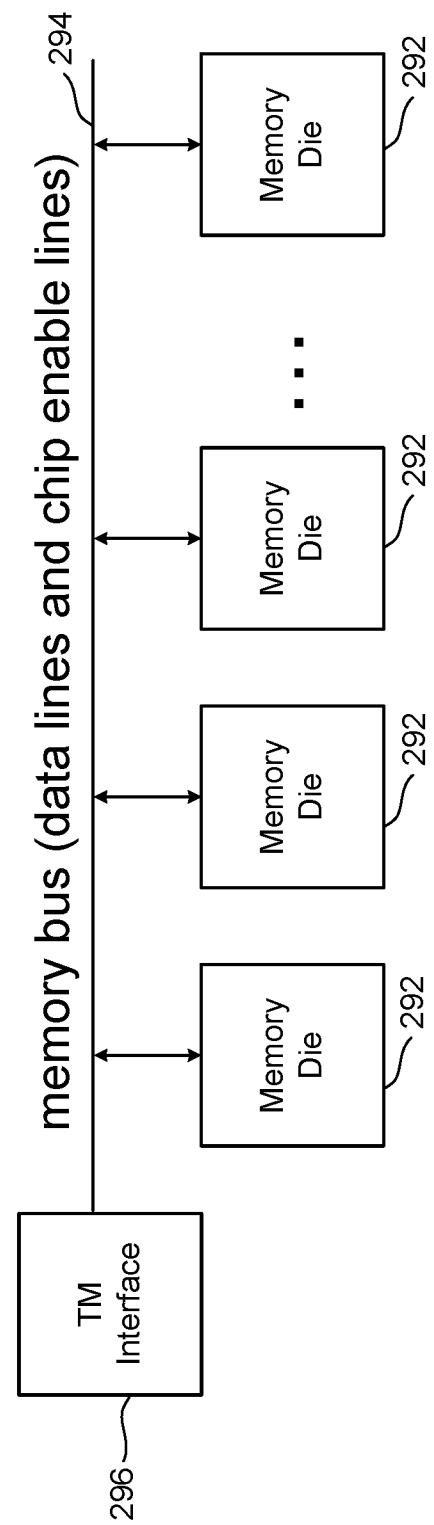
FIG. 4 is a block diagram of one embodiment of a memory package.

FIG. 4 is a block diagram of one embodiment of a memory package 104 that includes a plurality of memory die 292 connected to a memory bus (data lines and chip enable lines) 294. The memory bus 294 connects to a Toggle Mode Interface 296 for communicating with the TM Interface of a BEP circuit 112 (see e.g. FIG. 3). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

Figure 5:
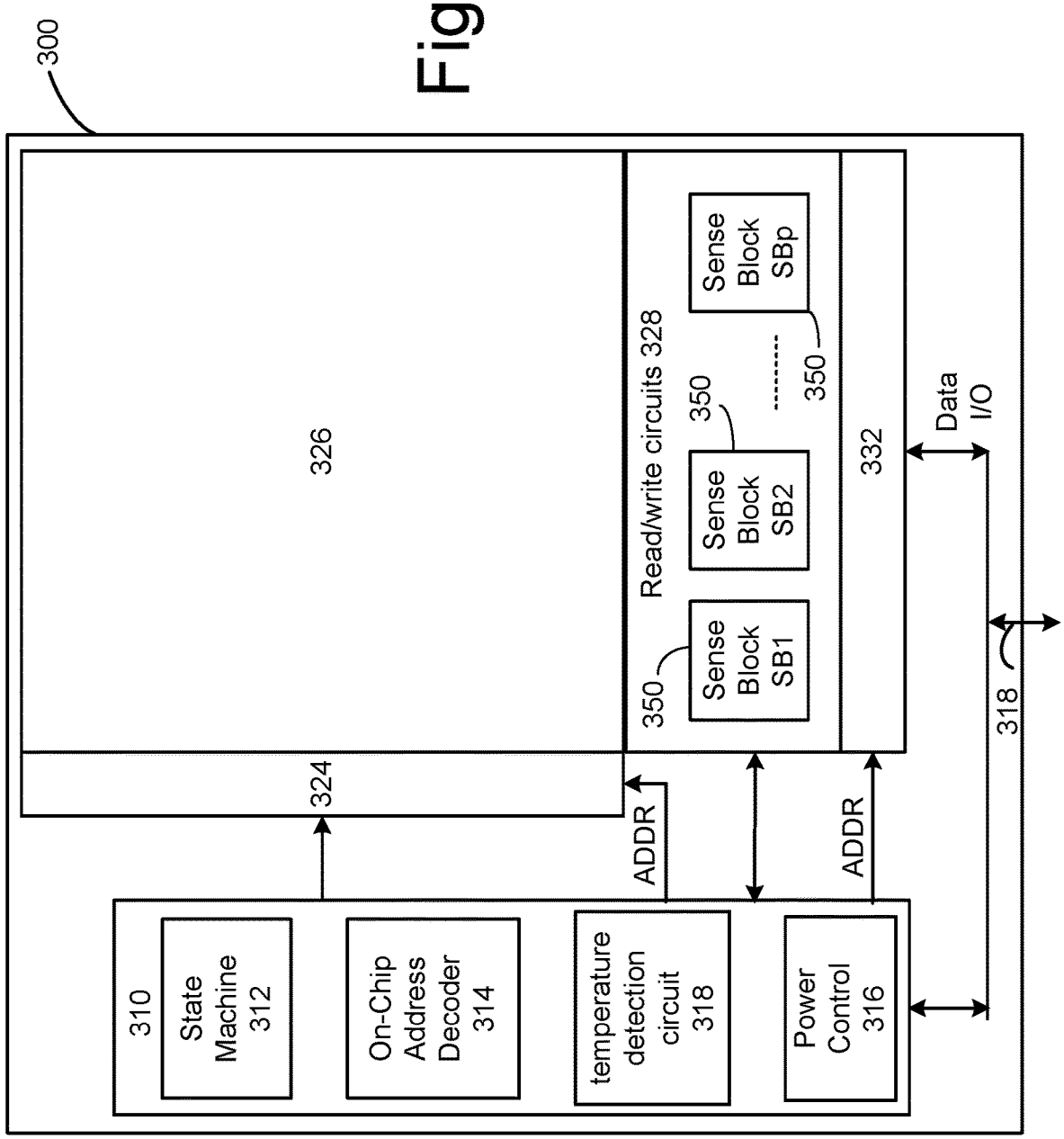
FIG. 5 is a block diagram of one embodiment of a memory die.

FIG. 5 is a functional block diagram of one embodiment of a memory die 300. The components depicted in FIG. 5 are electrical circuits. In one embodiment, each memory die 300 includes a memory structure 326, control circuitry 310, and read/write circuits 328. Memory structure 126 is addressable by word lines via a row decoder 324 and by bit lines via a column decoder 332. The read/write circuits 328 include multiple sense blocks 350 including SB1, SB2, . . . , SBp (sensing circuitry) and allow a page of memory cells to be read or programmed in parallel. Commands and data are transferred between the Controller and the memory die 300 via lines 318. In one embodiment, memory die 108 includes a set of input and/or output (I/O) pins that connect to lines 118.

Control circuitry 310 cooperates with the read/write circuits 328 to perform memory operations (e.g., write, read, and others) on memory structure 326, and includes a state machine 312, an on-chip address decoder 314, a power control circuit 316 and a temperature detection circuit 318. State machine 312 provides die-level control of memory operations. In one embodiment, state machine 312 is programmable by software. In other embodiments, state machine 312 does not use software and is completely implemented in hardware (e.g., electrical circuits). In one embodiment, control circuitry 310 includes buffers such as registers, ROM fuses and other storage devices for storing default values such as base voltages and other parameters.

The on-chip address decoder 314 provides an address interface between addresses used by Controller 102 to the hardware address used by the decoders 324 and 332. Power control module 316 controls the power and voltages supplied to the word lines and bit lines during memory operations. Power control module 316 may include charge pumps for creating voltages. The sense blocks include bit line drivers.

In one embodiment, memory structure 326 comprises a three dimensional memory array of non-volatile memory cells in which multiple memory levels are formed above a single substrate, such as a wafer. The memory structure may comprise any type of non-volatile memory that are monolithically formed in one or more physical levels of memory cells having an active area disposed above a silicon (or other type of) substrate. In one example, the non-volatile memory cells comprise vertical NAND strings with charge-trapping material such as described, for example, in U.S. Pat. No. 9,721,662, incorporated herein by reference in its entirety.

In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for memory cell architectures of the memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

As discussed above, in one embodiment the interface 130 between the memory system 100 and the host 120 is NVMe over PCIe. NVMe is an interface that allows host software to communicate with a non-volatile memory system. This interface is optimized for Enterprise and Client solid state drives, typically attached as a register level interface to the PCIe interface. The register interface and command set are specified apart from any usage model for the non-volatile memory system, but rather only specifies the communication interface to the non-volatile memory system. Thus, this specification does not specify whether the non-volatile memory system is used as a solid state drive, a main memory, a cache memory, a backup memory, a redundant memory, etc. (any of which can be implemented for system 100).

The NVMe interface provides submission and completion queues that are used for the host to submit commands and the memory system to provide an indication of the outcome from executing the submitted commands. An NVMe command (e.g. Read or Write) is initiated at the host and to a particular submission queue that lives in host memory. Once the command is inserted into a queue, the host writes to a per-queue doorbell register on the controller. This doorbell write wakes up the controller, which then probes the queue for the new request(s). It reads the queue entry, executes the command and finally appends a completion into a completion queue then notifies the host of this via an interrupt. The host wakes up, pops that completion off the queue and returns results to the user.

There are two main types of queues that are used: Administrative Queues and I/O Queues. Administrative Queues are used for configuring and managing various aspects of the controller. There is only one pair of Administrative queues per controller. I/O Queues are used to move NVMe protocol specific commands (e.g. Read, Write). There can be up to 64K I/O queues per controller. In some embodiments, there is one pair of I/O queues per processor core; however, processor cores can have more than on pair of I/O queues and/or the number of I/O queues can be unrelated to the number of processor cores. Each queue pair includes a submission queue and a completion queue. All of the queues reside in host memory.

A submission queue (SQ) is a circular buffer with a fixed slot size that the host software uses to submit commands for execution by the controller. Each submission queue entry is a command. Commands are 64 bytes in size.

A completion queue (CQ) is a circular buffer with a fixed slot size used to post status for completed commands. A completed command is uniquely identified by a combination of the associated SQ identifier and command identifier that is assigned by host software. Multiple submission queues may be associated with a single completion queue. This feature may be used where a single worker thread processes all command completions via one completion queue even when those commands originated from multiple submission queues. A Phase Tag (P) bit in each completion queue entry indicates whether the entry has been newly posted. This enables host software to determine whether the new entry was posted as part of the previous or current round of completion notifications. After reading and processing a completion queue entry, the controller inverts the Phase Tag bit for that entry.

Each of submission queues and completion queues have both head pointers and tail pointers. The tail pointer points to the next available entry to add an entry into the queue. After the producer adds an entry to a queue, the producer increments the tail pointer (taking into consideration that once it gets to the end of the queue, it will wrap back to zero—they are all circular queues.) The queue is considered empty if the head and tail pointers are equal. The consumer uses the head pointer to determine where to start reading from the queue, after examining the tail pointer and determining that the queue is non-empty. The consumer will increment the head pointer after reading each entry.

The submission queue's tail pointer is managed by the host. After one or more entries have been pushed into the queue, the tail pointer (that was incremented) is written to the controller via a submission queue doorbell register residing on the controller. The controller maintains the head pointer and begins to read the queue once notified of the tail pointer update. It can continue to read the queue until empty. As it consumes entries, the head pointer is updated, and sent back to the host via completion queue entries.

The completion queue's tail is managed by the controller, but unlike the host, the controller only maintains a private copy of the tail pointer. The only indication that there is a new completion queue entry is the Phase Tag bit in the completion queue entry that can be polled. Once the host determines an entry is available, it will read that entry and update the head pointer. The controller is notified of head pointer updates by host writes to the completion queue doorbell register.

Note that all work done by an NVMe controller is either pulled into or pushed out of that controller by the controller itself. The host merely places work into host memory and rings the doorbell ("you've got a submission entry to handle"). Later it collects results from the completion queue, again ringing the doorbell ("I'm done with these completion entries"). So the controller is free to work in parallel with the host. There is no requirement for ordering of completions—the controller can order it's work anyway it chooses.

Figure 6:
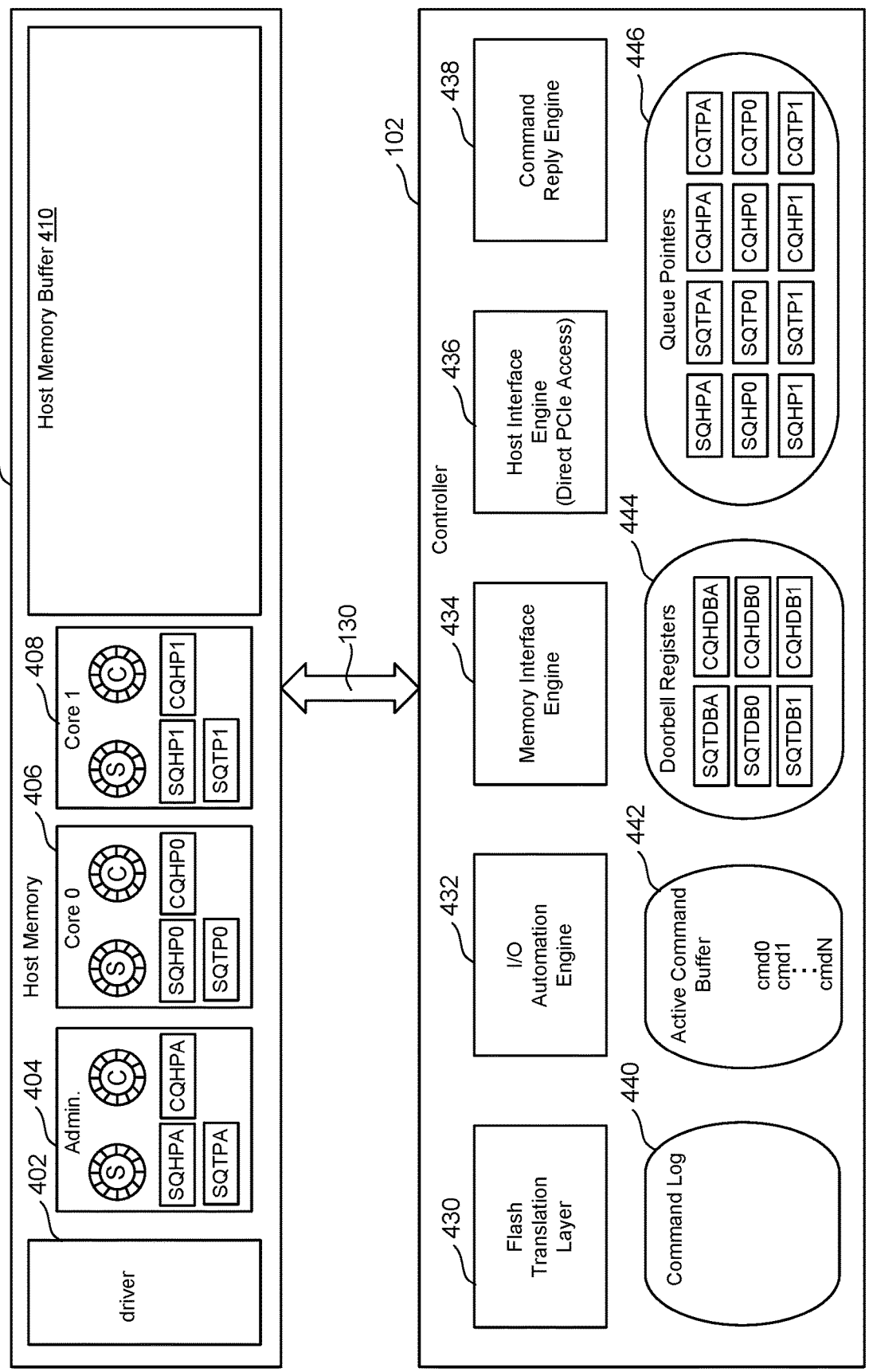
FIG. 6 is a logical block diagram of one embodiment of a Controller interfacing with a host.

FIG. 6 is a logical block diagram of the components of Controller 102 and the components residing in Host Memory 124 that are used to implement one embodiment of NVMe over PCIe interface 130 between memory system 100 and host 120. In one embodiment the host's physical memory (Host Memory 124) includes driver 402, data structure 404 for administrative commands, data structure 406 for Core 0, data structure 408 for Core 1, and Host Memory Buffer 410. Driver 402 is software on host 120 that interfaces with memory system 100. Data structure 404 includes the submission queue (S) and the completion queue (C) for administrative commands, and includes the submission queue head pointer (SQHPA), submission queue tail pointer (SQTPA), and the completion queue head pointer (CQHPA). In one embodiment, the system will maintain separate sets of queues for each Core. FIG. 6 shows sets of queues for two cores (Core 0 and Core 1); however, in other embodiments more or less than two cores can be implemented. The technology described herein is not limited to any number of cores. In other sets of embodiments, there can be a set of submission and completion queues for each thread. In some embodiments, a single core can have multiple sets of submission and completion queues. In the example of FIG. 6, there is a submission queue (S) and a completion queue (C) for Core 0 and a submission queue (S) and a completion queue (C) for Core 1. For example, data structure 406 includes the submission queue (S), completion queue (C), submission queue head pointer (SQHP0), submission queue tail pointer (SQTP0) and completion queue head pointer (CQHP0), all for Core 0. Data structure 408 includes the submission queue (S), completion queue (C), submission queue head pointer (SQHP1), submission queue tail pointer (SQTP1) and completion queue head pointer (CQHP1), all for Core 1. Host Memory Buffer 410 is a portion of Host Memory 124 that can be allocated (upon request from Controller 102) to be used by Controller 102.

FIG. 6 shows Controller 102 including five software modules, each representing processes running on Controller 102: Flash Translation Layer 430, I/O Automation Engine 432, Memory Interface Engine 434, Host Interface Engine 436 (direct PCIE access), and Command Replay Engine 438. Flash Translation Layer 430 translates between logical addresses used by Host 120 and physical addresses used by the various memory die within memory system 100. I/O Automation 432 accesses the various commands in the submission queue, executes those commands, and returns results in the completion queues. Memory Interface Engine 434 manages the interface between Controller 102 and the various memory packages 104. For example, Memory Interface Engine 434 may be implemented on processors 220 and 250 (see FIG. 3). Host Interface Engine 436 implements the interface between Controller 102 and Host 120. For example, Host Interface Engine 434 can be running on Host Processor 152 (see FIG. 2). Command Replay Engine 438 is used to replay or re-execute a sequence of commands, as discussed below. In one embodiment, Flash Translation Layer 430, I/O Automation Engine 432 and Command Replay Engine 438 are performed/implemented by memory processor 156 (see FIG. 2). In other embodiments, other architectures for Controller 102 can be used so that other processors or groups of processors can be used to implement the software modules 430-438.

FIG. 6 also shows Controller 102 having four sets of data: Command Log 440, Active Command Buffer 442, Doorbell Registers 444 and Queue Pointers 446. In one embodiment, sets of data 440, 442, 444 and 446 are stored in the local memory for Controller 102 (e.g. DRAM 106 of FIG. 1). Command Log 440 stores copies of a sequence of commands and associated timing information for those commands so that those commands can be replayed or re-executed at a later time. Active Command Buffer 442 stores the commands that have been accessed from the various submission queues and that are in line to be executed by Controller 102. Doorbell registers 444 are a set of registers that are operated as doorbells. As discussed above, when host 120 adds an entry to a submission queue or consumes an entry on a completion queue it will ring an appropriate doorbell by writing the updated pointer to that doorbell. Thus, FIG. 6 shows Doorbell Registers 444 including the Submission Queue Tail Doorbell for the administrative queues (SQTDBA), the Completion Queue Head Doorbell for the administration queues (CQHDBA), the Submission Queue Tail Doorbell for Core 0 (SQTDB0), the Completion Queue Head Doorbell for Core 0 (CQHDB0), Submission Queue Tail Doorbell for Core 1 (SQTDB1), and the Completion Queue Head Doorbell for Core 1 (CQHDB1).

Queue Pointers 446 include the head and tail pointers for the various sets of queues discussed above. In one embodiment, Controller 102 maintains a copy of the head and tail pointer for each queue. In the example of FIG. 6 there are six queues; therefore, Controller 102 stores six head pointers and six tail pointers. For example, FIG. 6 shows Queue Pointers 446 including the Submission Queue Head Pointer for the administrative queues (SQHPA), Submission Queue Tail Pointer for the administrative queues (SQTPA), the Completion Queue Head Pointer for the administration queues (CQHPA), the Completion Queue Tail Pointer for the administrative queues (CQTPA), the Submission Queue Head Pointer for Core 0 (SQHP0), the Submission Queue Tail Pointer for Core 0 (SQTP0), the Completion Queue Head Pointer for Core 0 (CQHP0), the Completion Queue Tail Pointer for Core 0 (CQTP0), the Submission Queue Head Pointer for Core 1 (SQHP1), the Submission Queue Tail Pointer for Core 1 (SQTP1), the Completion Queue Head Pointer for Core 1 (CQHP1), and the Completion Queue Tail Pointer for Core 1 (CQTP1). In other embodiments, the submission queues and completion queues can be replaced by other types of data structures. Any or all of the pointers in Queue Pointers 446 can be the command pointer of step 604.

Figure 7:
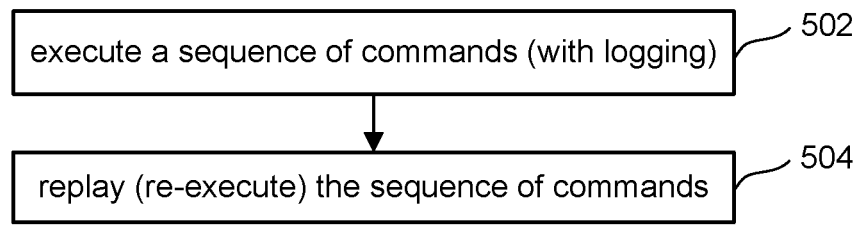
FIG. 7 is a flow chart describing one embodiment of a process for operating a memory system.

During the development, qualification and field debugging of memory system 100, certain exceptions may be triggered by specific sequence of commands. For example, a thermal stress reaction may occur after a very long write work load, or a timeout might occur at a specific queue depth when the commands within the queue are long-running. Under certain circumstances, a reset occurring during a specific command sequence may also trigger internal bugs or errors in the memory device. Identifying and addressing these situations often requires capturing bus traces of the host-memory interactions, and analyzing these traces for specific anomalies which indicate that an error has occurred. Since the interface between the host and memory is not normally monitored, debugging usually requires recreating the exact conditions that caused the error while monitoring/logging the activity on the interface. However, it can be difficult to recreate the exact conditions that cause an error. Therefore, it is proposed that the memory device 100 be configured to replay (or re-execute) the sequence of commands that caused the problem. FIG. 7 is a high level flow chart describing such a process. In step 502 of FIG. 7, Controller 102 executes a sequence of commands. In one embodiment, Controller 102 performs logging of the commands concurrently with executing the commands. For example, Controller 102 can be configured to receive a set of commands from a primary data structure in host memory and execute those commands, such as executing commands from a submission queue for one of the cores of the host processor. After executing the commands, the controller is configured to replay (or re-execute) the same sequence of commands in step 504 by writing the sequence of commands to an alternative data structure on the host memory's physical memory and executing against that alternate data structure. The executing against the alternate data structure includes transmitting a set of commands from the host to the memory system and executing the commands on the memory system. More details of the process at FIG. 7 are described below with respect to FIGS. 8-12. Note that the memory system may replay the sequence of commands in response to a request from the host, a request from an entity external to the memory system or a signal from an input to the memory system.

Figure 8:
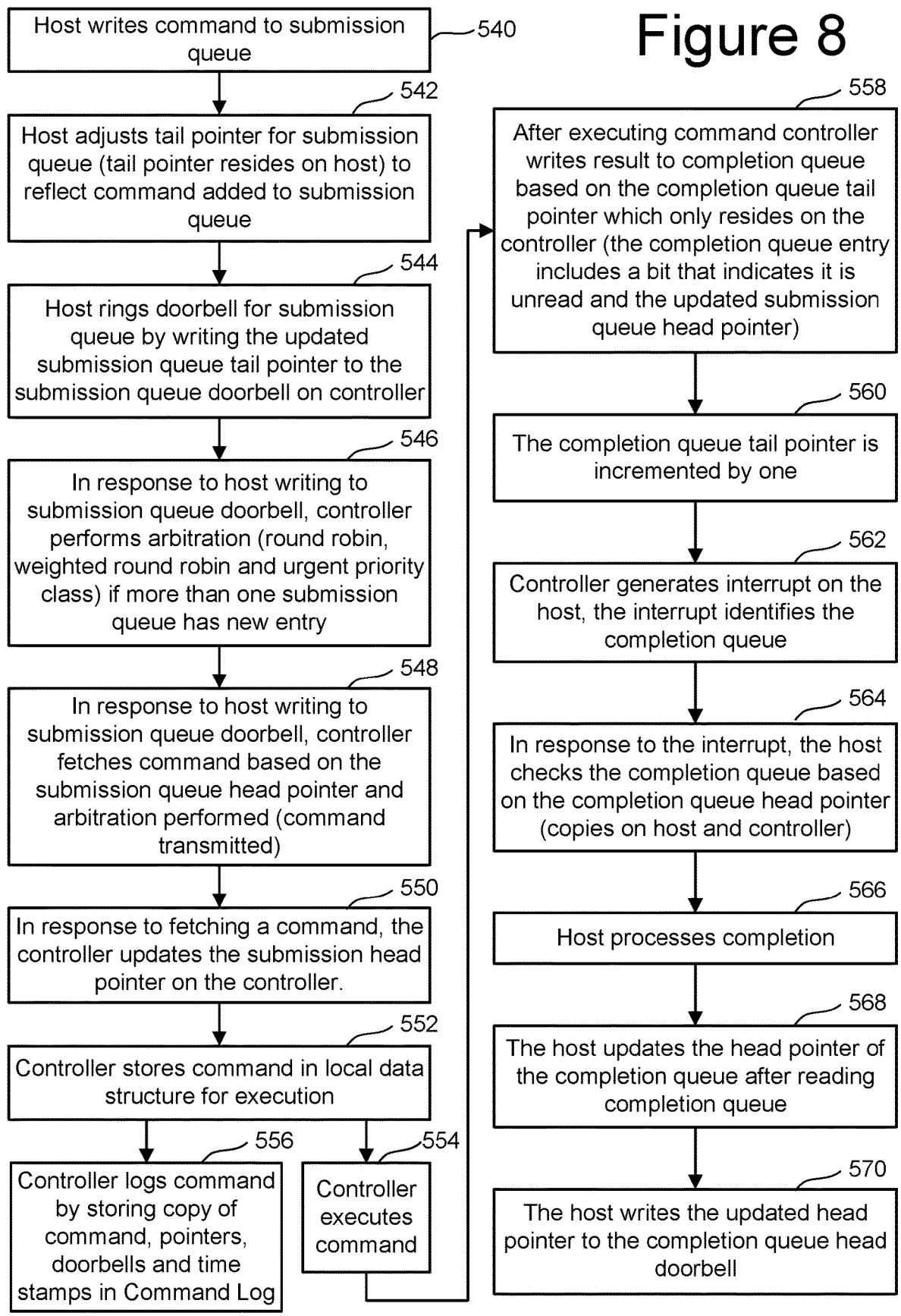
FIG. 8 is a flow chart describing one embodiment of a process for executing and logging a sequence of commands.

FIG. 8 is a flowchart describing one embodiment of a process of executing a sequence of commands, including logging those commands. That is, the process of FIG. 8 is one example implementation of step 502 of FIG. 7. In step 540 of FIG. 8, Host 120 writes a command to a Submission Queue. For example, host 120 can add a command to the Submission Queue (S) for Core 0. In step 542, host 120 adjusts the Tail Pointer for the Submission Queue to reflect the command added to the Submission Queue. For example, host 120 will update SQTP0 (see FIG. 6). In step 544, host 120 rings the doorbell for the Submission Queue by writing the updated Submission Queue Tail Pointer (SQTP0) to the Submission Queue Tail Doorbell (SQTDB) on Controller 102. In response to the host writing to the Submission Queue Tail Doorbell (SQTDB), Controller 102 performs arbitration if there is more than one Submission Queue with a new entry. There are multiple types of arbitration that can be performed. Three suitable examples include round robin arbitration, weighted round robin with urgent priority class arbitration, and vendor-specific arbitration; however, other types of arbitration can also be performed. In the general sense, arbitration is choosing which queue to obtain the next command from. In response to the host writing to the Submission Queue Tail Doorbell and in response to the arbitration, Controller 102 fetches the next command based on the value of the Submission Queue Head Pointer (SQHP0) and the arbitration performed in step 546. In step 550, in response to fetching the command, Controller 102 updates the Submission Head Pointer (SQHP0) on Controller 102. The Submission Head Pointer (SQHP0) will be sent back to the host via the Completion Queue, as discussed below. In this manner, both Controller 102 and Host 120 maintain copies of the Submission Queue Head Pointer (SQHP0) and the Submission Queue Tail Pointer (SQTP0). In step 552, Controller 102 stores the fetched command in the Active Command Buffer 442.

In step 554, Controller 102 executes the next command in Active Command Buffer 442. If logging is turned on, Controller 102 performs logging of the command in step 556 concurrently with the execution of the command in step 554. The logging includes storing a copy of the command, the pointers, the doorbells and a time stamp (or other timing information) in Command Log 440. Note in some embodiments, steps 540-552 are performed in a loop that is separate form and concurrent to steps 554 and 556.

In step 558, after executing the command, Controller 102 writes the results to the appropriate completion queue based on the Completion Queue Tail Pointer which only resides on the Controller 102. In this example, Controller 102 uses Completion Queue Tail Pointer CQTP0 to write in the completion queue (C) for Core 0. The Completion Queue entry added in step 558 includes the updated Submission Queue Head Pointer (SQHP0). In step 560, the Completion Queue Tail Pointer (CQTP0) is incremented. In step 562, Controller 102 generates an interrupt on Host 120. The interrupt identifies the appropriate Completion Queue that has been updated. In step 564, in response to the interrupt, Host 120 checks the appropriate Completion Queue at the entry pointed to by the Completion Queue Head Pointer. In step 566, host 120 processes the Completion Queue entry. In step 568, Host 120 updates the Completion Queue Head Pointer (CQHP0). In step 570, Host 120 writes the updated Completion Queue Head Pointer (CQHP0) to the Completion Queue Head Doorbell on the controller (CQHDB0). As long as there are commands in the Active Command Buffer 442, steps 554-570 will continuously be performed. Each time the host writes a command to Submission Queue steps 540-552 will be performed.

Figure 9:
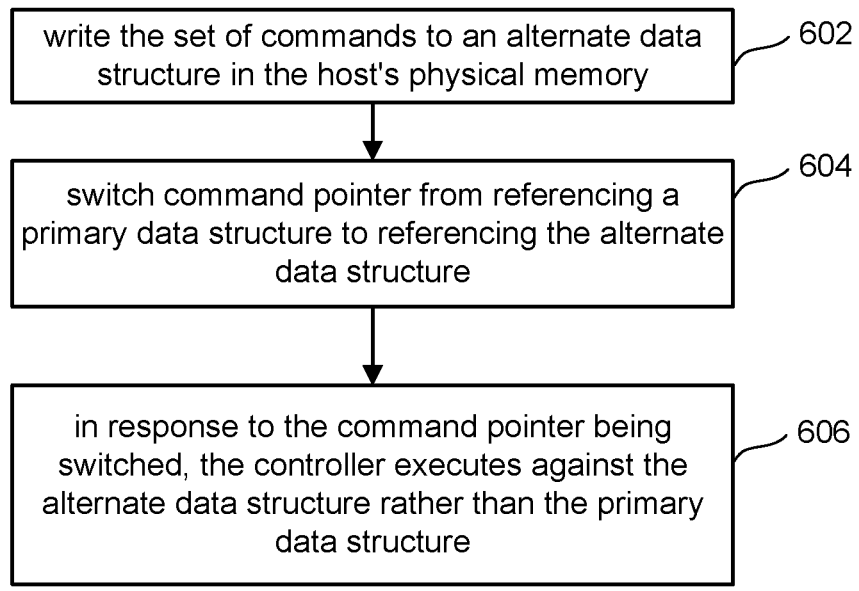
FIG. 9 is a flow chart describing one embodiment of a process for replaying (or re-executing) a sequence of commands.

FIG. 9 is a flowchart describing one embodiment of a process for replaying (or re-executing) the sequence of commands. That is, the process of FIG. 9 is one example implementation of step 504 of FIG. 7. In step 602 of FIG. 9, Controller 102 writes the set of commands to be replayed to an alternate data structure in the host's physical memory. In one example, the queues depicted in the host memory 124 in FIG. 6 are a primary data structure used for normal operation. Thus, step 602 includes writing the sequence of command to a location other than the queues depicted in the host memory 124 in FIG. 6. In step 604, Controller 102 switches its command pointer from referencing the primary data structure to the alternate data structure. The command pointer that is switched in step 604 can include any or multiple of pointers stored in Queue Pointers 446 discussed above. In some embodiments, the order of steps 602 and 604 can be switched. In some embodiments, steps 602 and step 604 can be performed concurrently. In step 606, in response to the command pointer being switched, Controller 102 executes against the alternate data structure rather than the primary data structure. In one example implementation of the process of FIG. 9, the memory system is a solid state drive that saves a set of commands being replayed to a memory on the host system, subsequently transmits the commands from that memory on the host system back to the solid state drive and executes the transmitted commands on the solid state drive.

Figure 10:
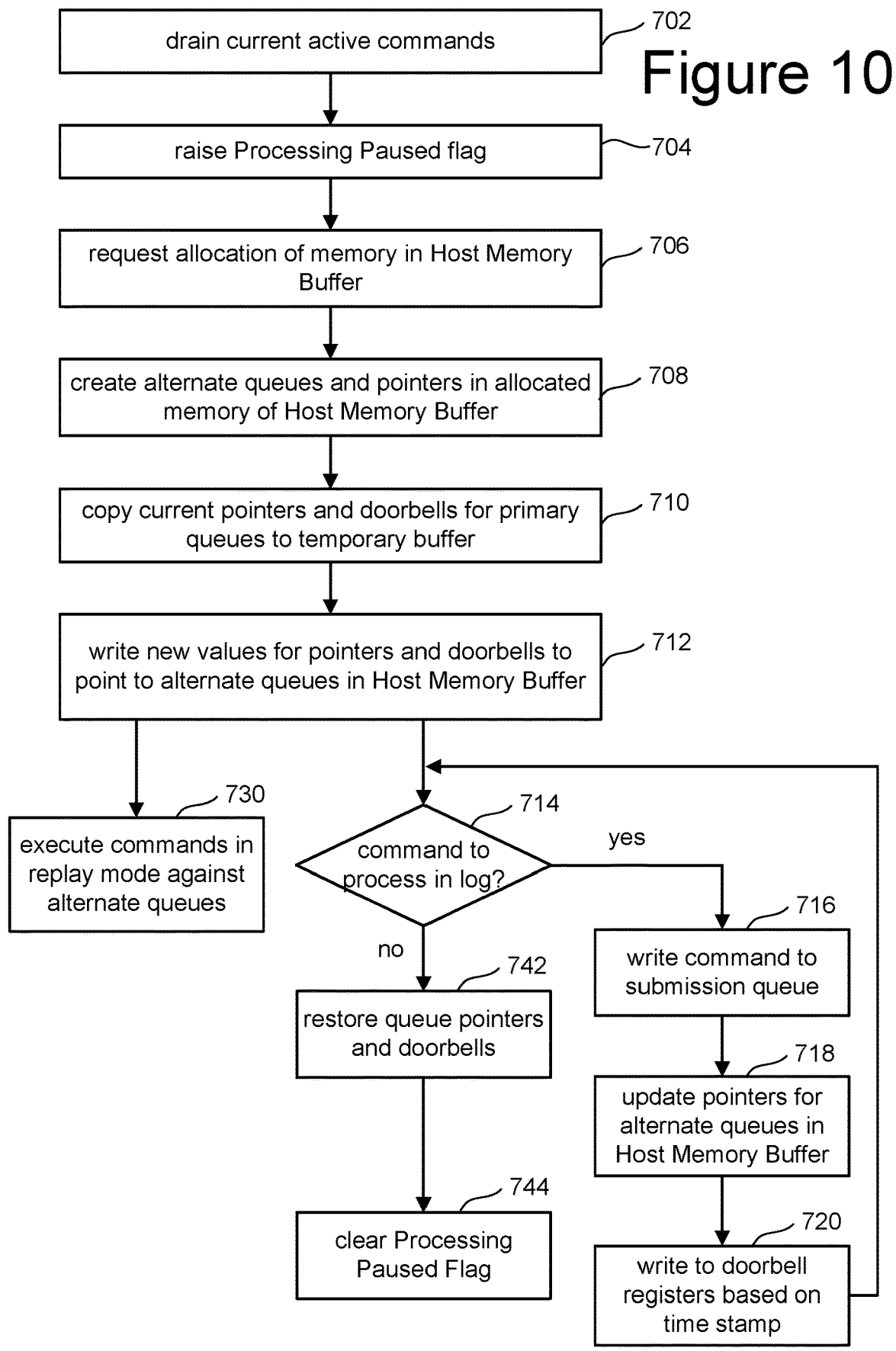
FIG. 10 is a flow chart describing one embodiment of a process for replaying (or re-executing) a sequence of commands.

FIG. 10 is a flowchart describing one embodiment for replaying (or re-executing) a sequence of commands. The process of FIG. 10 provides a more detailed implementation of the process of FIG. 9, and also represents an example embodiment of step 504 of FIG. 7. In step 702 of FIG. 10, Controller 102 drains the current active commands. That is, Controller 102 performs all the commands remaining in Active Command Buffer 442. In step 704, Controller 102 raises a Processing Paused Flag (also known as a Pause Flag), depicted as PP 151 in FIG. 2. In one embodiment, the Processing Paused Flag indicates to Host 120 that Controller 102 is busy and so Host 120 should stop sending commands until Controller 102 clears the flag. In step 706, Controller 102 sends a request to Host 120 to allocate space in Host Memory Buffer 410. In step 708, Controller 102 creates alternate queues and associated pointers in the allocated space of Host Memory Buffer 410. Step 602 of FIG. 9 discussed writing commands to an alternate data structure. One example of the alternate data structure is the alternate queues and associated pointers created in step 708. In step 710, Controller 102 copies the values of all the current pointers and doorbells for the primary queues to a temporary buffer in Controller 102. The primary queues are those of data structures 404, 406 and 408. The alternate queues are copies of data structures 404, 406 and 408 that are stored in Host Memory Buffer 410. The pointers stored in Queue Pointers 446 and the Doorbell Register values stored in Doorbell Registers 444 are copied to a temporary buffer in step 710. In step 712, new values for the pointers and doorbells are written to Doorbell Registers 444 and Queue Pointers 446 to point to the alternate queues that are stored in Host Memory Buffer 410. Thus, step 710 and 712 are analogous to step 604 of FIG. 9.

Figure 11:
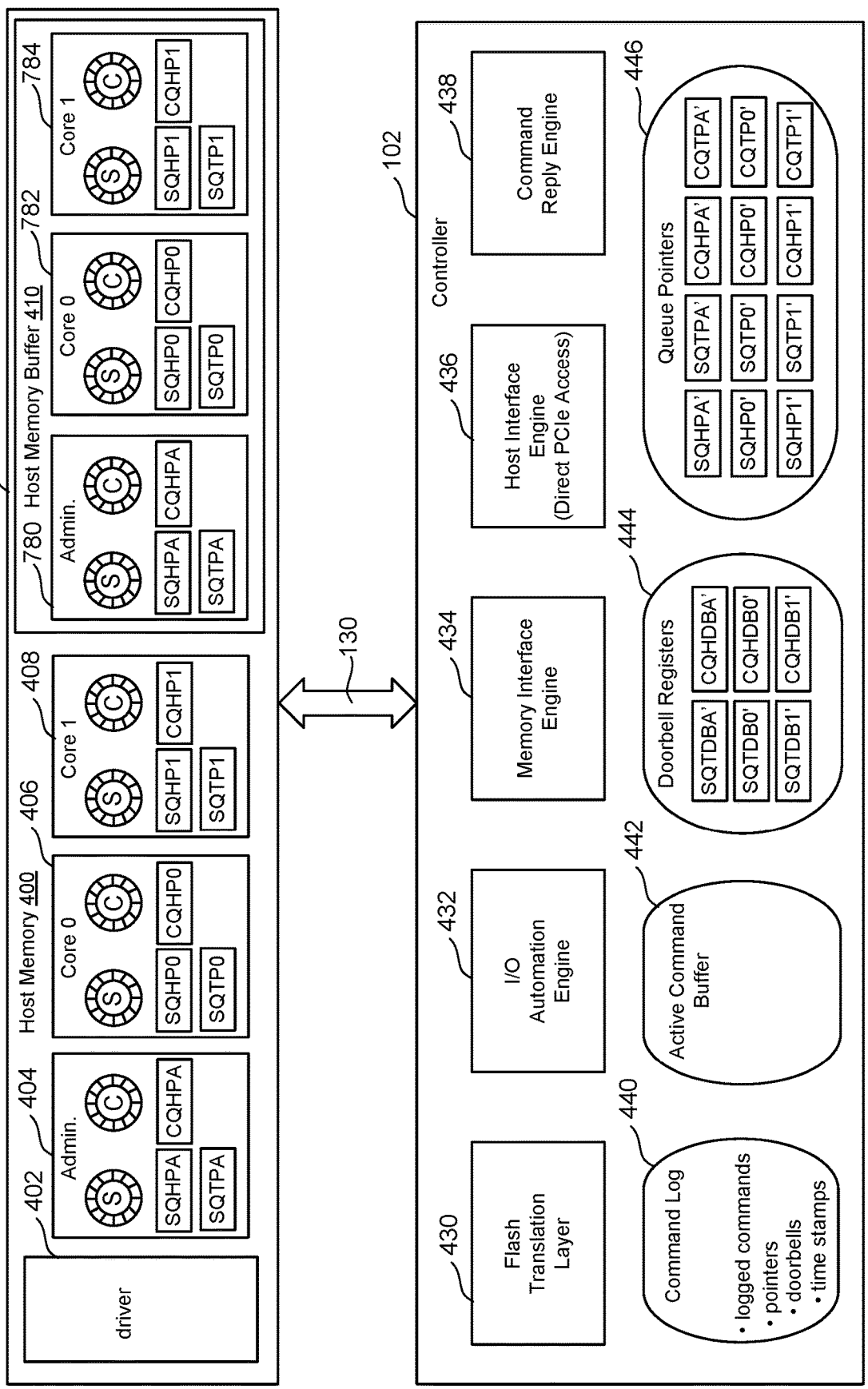
FIG. 11 is a logical block diagram of one embodiment of a Controller interfacing with a host.

FIG. 11 is a logical block diagram depicting Host Memory 124 and Controller 122. That is, FIG. 11 shows the same structure as FIG. 6; however, FIG. 11 shows the state of that structure after step 712 of FIG. 10. As can be seen, Host Memory Buffer 410 now includes alternate data structures 780, 782 and 784, which include copies of the queues stored in data structures 404, 406 and 408. When created, the queues of alternate data structures 780, 782, 784 may be empty of data or may have data copied from the queues of data structures 404, 406, 408 The alternate data structures include the Administration submission and completion queues, core 0 submission and completion queues, and core 1 submission and completion queues, with the associated pointers. Queue Pointers 446 include new pointers that point to data structures 780, 782 and 784, rather than data structures 404, 406 and 408. For example, FIG. 11 shows Queue Pointers 446 including the Submission Queue Head Pointer for the administrative queues (SQHPA'), Submission Queue Tail Pointer for the administrative queues (SQTPA'), the Completion Queue Head Pointer for the administration queues (CQHPA'), the Completion Queue Tail Pointer for the administrative queues (CQTPA'), the Submission Queue Head Pointer for Core 0 (SQHP0'), the Submission Queue Tail Pointer for Core 0 (SQTP0'), the Completion Queue Head Pointer for Core 0 (CQHP0'), the Completion Queue Tail Pointer for Core 0 (CQTP0'), the Submission Queue Head Pointer for Core 1 (SQHP1'), the Submission Queue Tail Pointer for Core 1 (SQTP1'), the Completion Queue Head Pointer for Core 1 (CQHP1'), and the Completion Queue Tail Pointer for Core 1 (CQTP1').

The values of Doorbell Registers 444 have been updated to point to data structures 780, 782 and 784. For example, FIG. 11 shows Doorbell Registers 444 including the Submission Queue Tail Doorbell for the administrative queues (SQTDBA'), the Completion Queue Head Doorbell for the administration queues (CQHDBA'), the Submission Queue Tail Doorbell for Core 0 (SQTDB0'), the Completion Queue Head Doorbell for Core 0 (CQHDB0'), Submission Queue Tail Doorbell for Core 1 (SQTDB1'), and the Completion Queue Head Doorbell for Core 1 (CQHDB1').

FIG. 11 shows that there are no more commands in Active Command Buffer 442 due to Controller 102 draining the Active Commands in step 702. Additionally, Command Log 440 includes the logged commands, pointers, doorbells and time stamps (and/or other timing information) that was added to the Command Log 440 in step 556 of FIG. 8.

Looking back at FIG. 10, after step 712, Controller 102 performs step 730 concurrently with performing the process of steps 714, 716, 718 and 720. As long as there is a command in Command Log 440 (step 714) then controller will write that command to the Submission Queue in Host Memory Buffer 410 (this is the alternate Submission Queue). Using the example discussed above, Controller 120 writes the command to the Submission Queue for Core 0. In step 718, Controller 102 updates the pointers for the alternate queue in the Host Memory Buffer 410 that was written to in step 716. For example, Controller 102 updates the Submission Queue Tail Pointer (SQTP0) in Host Memory Buffer 410 (data structure 782). In step 720, the appropriate doorbell of Doorbell Registers 444 will be written to reflect the update in the Submission Queue Tail Pointer (SQTP0) from step 716. For example, Doorbell Register SQTDB0' will be written to in step 720. When there are no more commands in Command Log 440 (step 714), then the queue pointers and doorbells will be restored to their value before the replaying of the sequence of commands in step 742. That is, the queue pointers and doorbells will be stored to the value that existed prior to step 706. In step 744, the Processing Pause Flag is cleared so that the system enters normal operation again and Host 102 is allowed to send new commands.

Concurrently with performing step 714-720, step 730 is performed in which the next command is executed (in replay mode). At this time, Controller 102 execute commands from the alternate queues of data structure 780, 782 and 784 in response to the doorbells being written in step 720. Step 730 is performed by I/O Automation Engine 432 and Flash Translation Layer 430 in the same manner that commands are normally executed. Similarly, step 702 is performed by I/O Automation Engine 432 and Flash Translation Layer 430. However, in one embodiment, steps 704-720 and 742-744 are performed by Command Replay Engine 438.

FIG. 12 is a flowchart describing one embodiment for replaying commands (or executing commands in the replay mode against the alternate queues). That is, the process of FIG. 12 is one example implementation of step 730 of FIG. 10 that includes the Controller 102 executing the commands from the Host Memory Buffer 410 on Host 120. In step 800, Command Replay Engine 438 writes a command from the Command Log 442 to one of the Submission Queues in Host Memory Buffer 410. Step 800 is analogous to step 716 of FIG. 10. In step 802 of FIG. 12, Command Replay Engine 438 adjusts the tail pointer for the Submission Queue (tail pointer resides on the host) to reflect the command added to the Submission Queue. Step 802 of FIG. 12 is analogous to step 718 of FIG. 10. In step 804 of FIG. 12, the Command Replay Engine 438 rings the doorbell for the Submission Queue by writing the updated Submission Queue Tail Pointer to the Submission Queue Doorbell on Controller 102, per the timing identified by the time stamp in the Command Log 440. Step 804 of FIG. 12 is analogous to step 720 of FIG. 10.

The remaining steps of FIG. 12 include executing the commands by the I/O Automation Engine 432 and Flash Translation Layer 430. In step 806 of FIG. 12, in response to the writing to the Submission Queue Doorbell, the controller (e.g. I/O Automation Engine 432) performs arbitration if more than one Submission Queue has a new entry. In response to writing to the Submission Queue Doorbell, the controller fetches the next command based on the Submission Queue Head Pointer and the arbitration performed. The command is fetched from an alternate submission queue in Host Memory Buffer 410. That fetched command is stored in the Active Command Buffer 442 in step 810 of FIG. 12. In step 812, in response to fetching the command, Controller 102 updates the appropriate Submission Queue Head Pointer on Controller 102. In step 814, Controller 102 executes the command from the Active Command Buffer 442. The executing of the command could include performing a write to or read from the non-volatile memory packages 104 using Flash Translation Layer 430. In step 816 of FIG. 12, after executing the command, Controller 102 writes the result to the Completion Queue based on the Completion Queue Tail Pointer, which only resides in Controller 102. In step 818, the Completion Queue Tail Pointer is incremented by one by Controller 102. In step 820, Controller 102 generates an interrupt on Host 120. The interrupt identifies the Completion Queue. However in this case, the Completion Queue is an alternate queue in Host Memory Buffer 410. Host 120 is not aware of these alternate queues. Therefore Host 120 does not perform any action in response to the interrupt (step 822). In step 824, Command Replay Engine 438 updates the Completion Queue Head Pointer after reading the Completion Queue. In step 826, Command Replay Engine 438 writes the updated Completion Queue Head Pointer to the Completion Queue Doorbell.

The above-described technology provides for a memory system that replays or re-executes a sequence of commands after those commands were originally performed. By replaying or re-executing those commands, the system can be debugged to identify the source of a problem or a remedy for the problem.

One embodiment includes a memory system, comprising non-volatile memory and a controller connected to the non-volatile memory. The controller is configured to write a set of commands to an alternate data structure in a host's physical memory and switch its command pointer from referencing a primary data structure to referencing the alternate data structure. In response to the command pointer being switched the controller is configured to execute against the alternate data structure rather than the primary data structure.

One embodiment includes a method, comprising a solid state drive saving a set of commands in a memory on a host system connected to the solid state drive; transmitting the commands from the memory on the host system to the solid state drive; and executing the transmitted commands on the solid state drive.

One embodiment includes an apparatus comprising a host interface configured to be connected to a host, a memory interface configured to be connected to non-volatile memory and a processor connected to the host interface and the memory interface. The processor is configured to execute a sequence of commands for memory operations. The processor is configured to replay the sequence of commands by writing a copy of the sequence of commands to physical memory on the host via the host interface and executing the copy of the sequence of commands from the physical memory on the host.

One embodiment includes a solid state drive, comprising a non-volatile memory die and a controller connected to the non-volatile memory die. The controller configured to communicate with a host external to the solid state drive. The controller comprises a command log configured to store a sequence of commands received from a host and means for replaying the sequence of commands after they have been executed by the controller by reading the commands from the command log, writing the commands read to a memory on the host, and executing, at the controller, the commands from the memory on the host.

In one embodiment, the means for replaying the sequence of commands comprises software running on a processor such as, for example, Command Reply Engine 438 running on Controller 102 performing the processes of FIG. 9 or FIG. 10, as well as other variations on those processes. Other software or hardware that are part of a memory controller can also be used.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A memory system, comprising:
   non-volatile memory; and
   a controller connected to the non-volatile memory, wherein the controller is configured to:
      write a set of commands to an alternate data structure in a physical memory of a host,
      switch a command pointer from referencing a primary data structure to referencing the alternate data structure, and
      in response to the command pointer being switched, execute against the alternate data structure rather than the primary data structure.

2. The memory system of claim 1, wherein:
   the primary data structure is created by the host;
   the alternate data structure is created in response to a request from the controller; and
   the controller is further configured to:
      receive the set of commands from the primary data structure in the physical memory of the host,
      execute the commands, and
      after executing the commands, replay the set of commands by the writing of the set of commands to the alternate data structure and executing against the alternate data structure.

3. The memory system of claim 1, wherein:
   the controller is configured to execute against the alternate data structure by transmitting the set of commands from the host to the memory system and executing the commands from the memory system; and
   the host is external to and configured to be connected to the memory system.

4. The memory system of claim 1, wherein the controller is further configured to:
   receive the set of commands from the host;
   store the set of commands in a log in the memory system prior to writing the set of commands to the alternate data structure; and
   write the set of commands to the alternate data structure from the log.

5. The memory system of claim 4, wherein the controller is further configured to:
   store, in the log, timing information for the set of commands; and
   use the timing information to execute the set of commands from the alternate data structure.

6. The memory system of claim 1, wherein the controller is further configured to:
   execute the set of commands; and
   after executing the set of commands, replay the set of commands by the executing against the alternate data structure.

7. The memory system of claim 6, wherein the controller is further configured to:
   when replaying the set of commands:
      assert a pause flag to the host prior to executing against the alternate data structure; and
      remove the pause flag subsequent to executing against the alternate data structure.

8. The memory system of claim 6, wherein the controller is further configured to:
   when replaying the set of commands:
      complete current active commands;
      assert a pause flag to the host prior to executing against the alternate data structure;
      allocate memory space in the host's physical memory for the alternate data structure;
      trigger execution of the set of commands in the alternate data structure; and
      remove the pause flag to the host subsequent to executing against the alternate data structure.

9. The memory system of claim 1, wherein:
   the primary data structure is a first queue created and managed by the host and on the host; and
   the alternate data structure is a second queue on the host.

10. The memory system of claim 1, wherein:
    the alternate data structure includes an alternate submission queue and an alternate completion queue; and
    the primary data structure includes a primary submission queue and a primary completion queue in the host's physical memory.

11. The memory system of claim 10, wherein:
    the command pointer comprises a submission queue tail pointer; and
    the controller is further configured to:
       maintain a submission queue head pointer, a completion queue head pointer, and a completion queue tail pointer;
       switch the submission queue head pointer, the completion queue head pointer, and the completion queue tail pointer from referencing the primary data structure to referencing the alternate data structure; and
       execute against the alternate data structure by:
          using the submission queue tail pointer and the submission queue head pointer to access one or more commands in the alternate submission queue and execute the one or more commands;
          using the completion queue head pointer and the completion queue tail pointer to insert one or more completion entries in the alternate completion queue; and
          after inserting one or more completion entries in the alternate completion queue, interrupting the host.

12. The memory system of claim 1, wherein:
    the non-volatile memory and the controller are part of a solid state drive; and
    the controller is further configured to implement a NVM Express interface with the host.

13. A method comprising:
    a solid state drive saving a set of commands in a memory on a host system connected to the solid state drive;

transmitting the commands from the memory on the host system to the solid state drive;

executing the transmitted commands on the solid state drive; and the solid state drive executing the set of commands prior to the saving the set of commands in the memory on the host system;

wherein the saving the set of commands in the memory on the host system, the transmitting the commands, and the executing the transmitted commands together comprise the solid state drive re-executing the set of commands.

14. The method of claim 13, further comprising:

the solid state drive storing the set of commands in a log when executing the set of commands prior to the saving the set of commands in the memory on the host system, wherein the saving the set of commands in the memory on the host system comprises:

reading the set of commands from the log; and transmitting the set of commands read to the memory on the host system.

15. The method of claim 13, further comprising:

the solid state drive indicating to the host to pause sending commands for memory operations when re-executing the set of commands.

16. An apparatus, comprising:

a host interface configured to be connected to a host;

a memory interface configured to be connected to non-volatile memory; and a processor connected to the host interface and the memory interface, wherein the processor is configured to:

execute a sequence of commands for memory operations, and replay the sequence of commands by writing a copy of the sequence of commands to physical memory on the host via the host interface and executing the copy of the sequence of commands from the physical memory on the host.

17. The apparatus of claim 16, further comprising a local memory connected to the processor and configured to:

store the copy of the sequence of commands to be written to the physical memory on the host; and store a pointer to a first memory structure on the host, wherein:

the processor is further configured to change the pointer to reference a second memory structure on the host in response to the processor replaying the sequence of commands; and the copy of the sequence of commands is stored in the second memory structure on the host.

18. A solid state drive, comprising:

a non-volatile memory die; and a controller connected to the non-volatile memory die and configured to communicate with a host external to the solid state drive, the controller comprising:

a command log configured to store a sequence of commands received from a host, and means for replaying the sequence of commands after the sequence of commands has been executed by the controller by reading the commands from the command log, writing the commands read to a memory on the host, and executing, at the controller, the commands from the memory on the host.

19. The solid state drive of claim 18, wherein the controller is further configured to:

execute the sequence of commands prior to replaying the sequence of commands; and store the sequence of commands in the command log in coordination with the executing the sequence of commands prior to replaying.

* * * * *